(12) United States Patent
Lee et al.

(10) Patent No.: US 7,408,434 B2
(45) Date of Patent: Aug. 5, 2008

(54) INDUCTOR EMBEDDED IN SUBSTRATE, MANUFACTURING METHOD THEREOF, MICRO DEVICE PACKAGE, AND MANUFACTURING METHOD OF CAP FOR MICRO DEVICE PACKAGE

(75) Inventors: Moon-chul Lee, Yongin-si (KR); Jong-oh Kwon, Suwon-si (KR); Woon-bae Kim, Suwon-si (KR); Jea-shik Shin, Suwon-si (KR); Jun-sik Hwang, Yongin-si (KR); Eun-sung Lee, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 11/400,637

(22) Filed: Apr. 10, 2006

(65) Prior Publication Data
US 2006/0290457 A1   Dec. 28, 2006

(30) Foreign Application Priority Data
Jun. 27, 2005   (KR) .................. 10-2005-0055796

(51) Int. Cl.
*H01F 5/00* (2006.01)
*H01L 23/02* (2006.01)

(52) U.S. Cl. .................. 336/200; 336/232; 336/223; 257/378

(58) Field of Classification Search .......... 336/200, 336/223, 232; 257/678
See application file for complete search history.

(56) References Cited

U.S. PATENT DOCUMENTS

| 7,012,327 | B2 * | 3/2006 | Huff et al. ............ 257/686 |
| 2004/0016995 | A1 * | 1/2004 | Kuo et al. ............ 257/678 |
| 2005/0275497 | A1 * | 12/2005 | Ramadan et al. ........ 336/200 |

FOREIGN PATENT DOCUMENTS

KR   10-2001-0076787 A   8/2001

* cited by examiner

*Primary Examiner*—Anh Y Mai
(74) *Attorney, Agent, or Firm*—Sughrue Mion, PLLC

(57) ABSTRACT

An inductor embedded in a substrate, including a substrate, a coil electrode formed by filling a metal in a spiral hole formed on the substrate, an insulation layer formed on the substrate, and an external connection pad formed on the insulation layer to be connected to the coil electrode. The inductor-embedded substrate can be used as a cap for a micro device package by forming a cavity on its bottom surface.

8 Claims, 5 Drawing Sheets

INDUCTOR EMBEDDED IN SUBSTRATE, MANUFACTURING METHOD THEREOF, MICRO DEVICE PACKAGE, AND MANUFACTURING METHOD OF CAP FOR MICRO DEVICE PACKAGE

CROSS-REFERENCE TO RELATED APPLICATIONS

This application claims priority from Korean Patent Application No. 2005-55796, filed on Jun. 27, 2005 in the Korean Intellectual Property Office, the entire content of which is incorporated herein by reference.

BACKGROUND OF THE INVENTION

1. Field of the Invention

Apparatuses and methods consistent with the present invention relate to an inductor, and more particularly, to an inductor embedded in a substrate, a manufacturing method thereof, a micro device package using the same, and a manufacturing method of a cap for the micro device package.

2. Description of the Related Art

Recently, portable electronic apparatuses such as video apparatuses, personal computers, cellular phones and flat type displays have been rapidly reduced in thickness and size. Electronic circuits including magnetic devices such as inductors and transformers that are built in the above apparatuses are strongly required to cope with the small-size, high integration, and radio-frequency (RF) tendencies of the devices.

A high-Q inductor is a common characteristic of most of the communication semiconductor devices. A related art method for forming the inductors in the semiconductor device includes depositing a metal having a thickness of at least 3 µm on the top layer of the circuit. However, this method requires an area over 300 µm×300 µm to form ten inductors. The area is not used for the other circuits due to electromagnetic interferences. That is, the general inductor has a low inductance as compared with design space utilization. It is therefore difficult to manufacture an inductor having a high Q factor and a low insertion loss in the restricted space.

In addition, a current process technique for forming a high-Q inductor using photoresist and copper requires a two or higher mask level and a two or higher exposure step. However, an inductor having an air gap is not compatible with the current process technology. That is, the inductor having the air gap needs a high difficulty process. Especially, in wet etching for floating the structure, the structure is adhered to the substrate. Moreover, the inductor having the air gap does not show sufficient solidity as a device.

On the other hand, a packaging technology for making a few devices with a single chip is required with the small size and high integration tendency of the electronic circuits. The general inductor and the manufacturing method thereof cannot embody the single chip package.

SUMMARY OF THE INVENTION

The present invention provides an inductor embedded in a substrate which has a high inductance as compared with design space utilization.

Further, the present invention provides an inductor embedded in a substrate which simplifies the whole manufacturing process, improves solidity and has a high Q factor and a low insertion loss.

Additionally, the present invention provides an inductor embedded in a substrate which can easily compose a single chip package with other devices.

Further, the present invention provides a manufacturing method of the inductor embedded in the substrate which has the above characteristics.

The present invention also provides a micro device package using the inductor embedded in the substrate which has the above characteristics, and a manufacturing method of a cap for the micro device package.

According to an aspect of the invention, there is provided an inductor embedded in a substrate, including a substrate and a coil electrode. The coil electrode comprises metal, and fills a hole formed on the substrate.

In an exemplary embodiment, the coil electrode is disposed in a linear spiral shape or curved spiral shape. One of ordinary skill in the art will recognize that the shapes of the exemplary embodiments are not intended to be limit other shapes from being used.

Also, the substrate may be a Si substrate, and the coil electrode may be made of gold, silver or copper.

According to another aspect of the invention, there is provided an inductor embedded in a substrate, including: a substrate; a coil electrode formed by filling a metal in a hole formed on the substrate; an insulation layer formed on the substrate; and an external connection pad formed on the insulation layer to be connected to the coil electrode.

The external connection pad may be made of the same metal as the coil electrode, and the insulation layer may be made of a low dielectric material.

According to yet another aspect of the invention, there is provided a manufacturing method of an inductor embedded in a substrate, including: forming a seed layer for plating on a bottom surface of a substrate; forming an etch mask pattern on the top surface of the substrate; forming a hole on the substrate according to the etch mask pattern; forming a coil electrode by filling a metal in the hole by a plating process using the seed layer; forming an insulation layer pattern on the top surface of the substrate; and forming an external connection pad on the insulation layer.

According to yet another aspect of the invention, there is provided a micro device package, including: a package body on which a micro device and an electrode pad are formed; and a cap coupled to the package body, for sealing up the micro device. The cap includes: a substrate having a cavity on its bottom surface; an inverter having a coil electrode formed by filling a metal in a hole formed on the substrate; a device connection pad formed on the bottom surface of the substrate to contact the electrode pad of the package body; and a second external connection pad connected to the device connection pad and exposed through the top surface of the substrate.

In an exemplary embodiment, the coil electrode is disposed in a linear spiral shape or curved spiral shape.

The substrate may be a Si substrate, the coil electrode may be made of gold, silver or copper, and the second external connection pad may be made of the same metal as the coil electrode.

In another exemplary embodiment, the micro device is a microelectromechanical system (MEMS) device such as an RF duplexer and a micro switch.

According to yet another aspect of the invention, there is provided a manufacturing method of a cap for a micro device package, including the steps of: forming a cavity on a bottom surface of a substrate; forming a seed layer for plating on the bottom surface of the substrate including the cavity; forming an etch mask pattern on the top surface of the substrate; forming a hole on the substrate according to the etch mask pattern; forming a coil electrode by filling a metal in the hole by a plating process using the seed layer; forming an insulation layer pattern on the top surface of the substrate; forming an external connection pad on the insulation layer; and forming an electrode pad and a sealing pad by patterning the seed layer on the bottom surface of the substrate.

BRIEF DESCRIPTION OF THE DRAWINGS

The above aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

An inductor embedded in a substrate, a manufacturing method thereof, a micro device package using the same, and a manufacturing method of a cap for the micro device package in accordance with the present invention will now be described in detail with reference to the accompanying drawings. Well-known functions or constructions are not described in detail since they would obscure the invention in unnecessary detail.

Figure 1A:
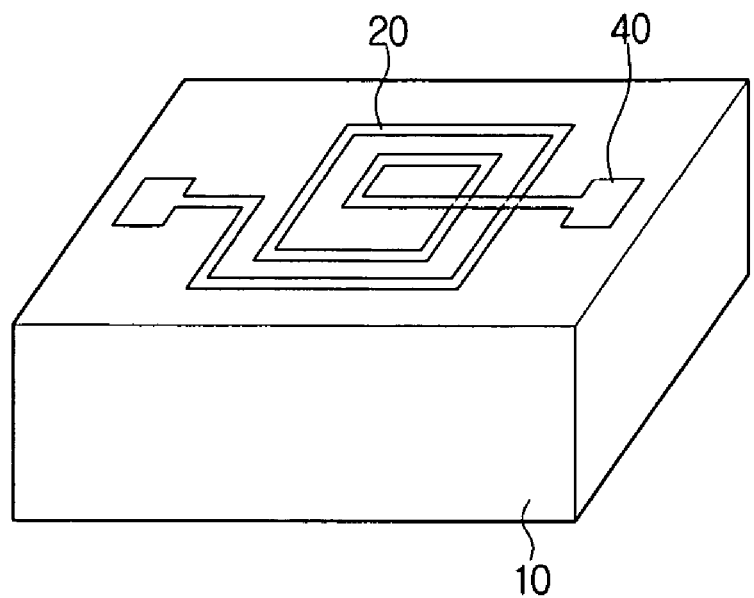
FIGS. 1A and 1B are a perspective view and a cross-sectional view illustrating an inductor embedded in a substrate in accordance with an exemplary embodiment of the present invention.
Figure 1B:
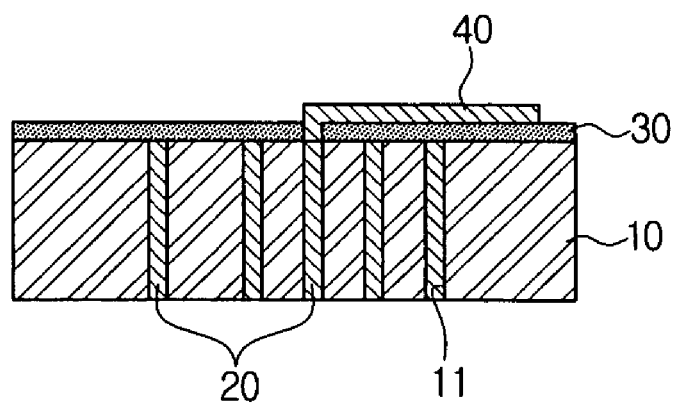

Referring to FIGS. 1A and 1B, an inductor includes a substrate 10 and a coil electrode 20.

A spiral hole 11 is formed on the substrate 10 to pass through the substrate 10 in the up/down (substantially vertically) direction. The coil electrode 20 is embedded in the substrate 10 by filling a metal in the hole 11. An insulation layer 30 is formed on the top surface of the substrate 10. A bridge structure external connection pad 40 is formed on the insulation layer 30 to be connected to the coil electrode 20.

The substrate 10 is a silicon (Si) or glass substrate. Especially, a high resistivity Si substrate is advantageous. In exemplary embodiments, the coil electrode 20 is made of a metal having high electric conductivity, such as gold, silver and copper, and the external connection pad 40 is made of the same metal as the coil electrode 20. On the other hand, the insulation layer 30 is made of a low dielectric material. In addition, the hole 11 can be formed in other shapes, such as a linear spiral shape or curved spiral shape, for example.

In accordance with the present invention, an inductor embedded in the substrate provides the coil electrode 20 having a high aspect ratio section, thereby improving a Q factor and reducing an insertion loss.

Figure 2A:
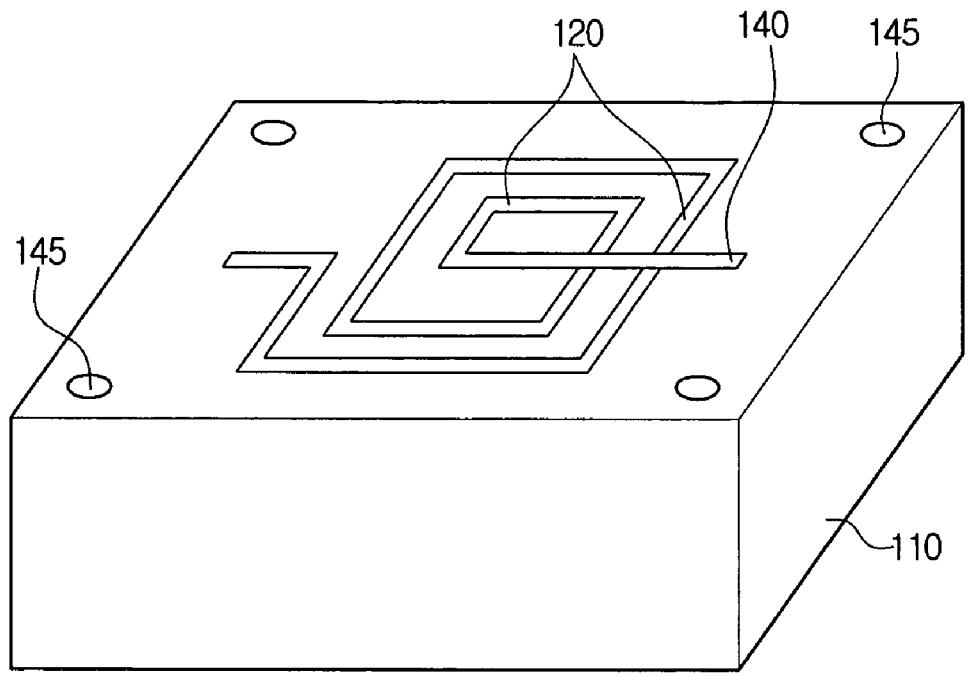
FIGS. 2A and 2B are a perspective view and a cross-sectional view illustrating a cap for a micro device package having the inductor of FIG. 1.
Figure 2B:
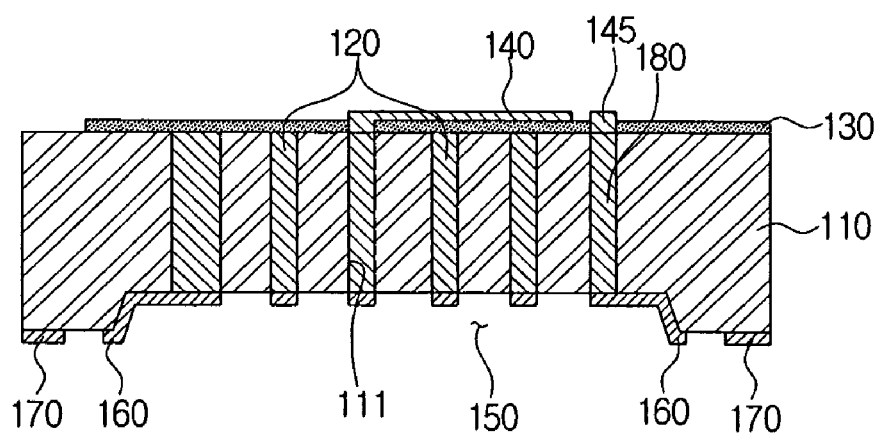

FIGS. 2A and 2B are a perspective view and a cross-sectional view illustrating the cap for the micro device package having the inductor embedded in the substrate as explained above. As illustrated in FIGS. 2A and 2B, the structure of the cap for the micro device package is substantially similar to the structure of FIG. 1, except that a cavity 150 is formed on a bottom surface of a substrate 110, a device connection pad 160 and a sealing pad 170 are formed at both sides of the cavity 150, and a second external connection pad 145 is formed on the top surface of the substrate 110. Accordingly, related reference numerals are used and detailed explanations are omitted. Reference numeral 180 denotes a member for electrically connecting the device connection pad 160 to the second external connection pad 145 on the substrate 110.

Figure 3:
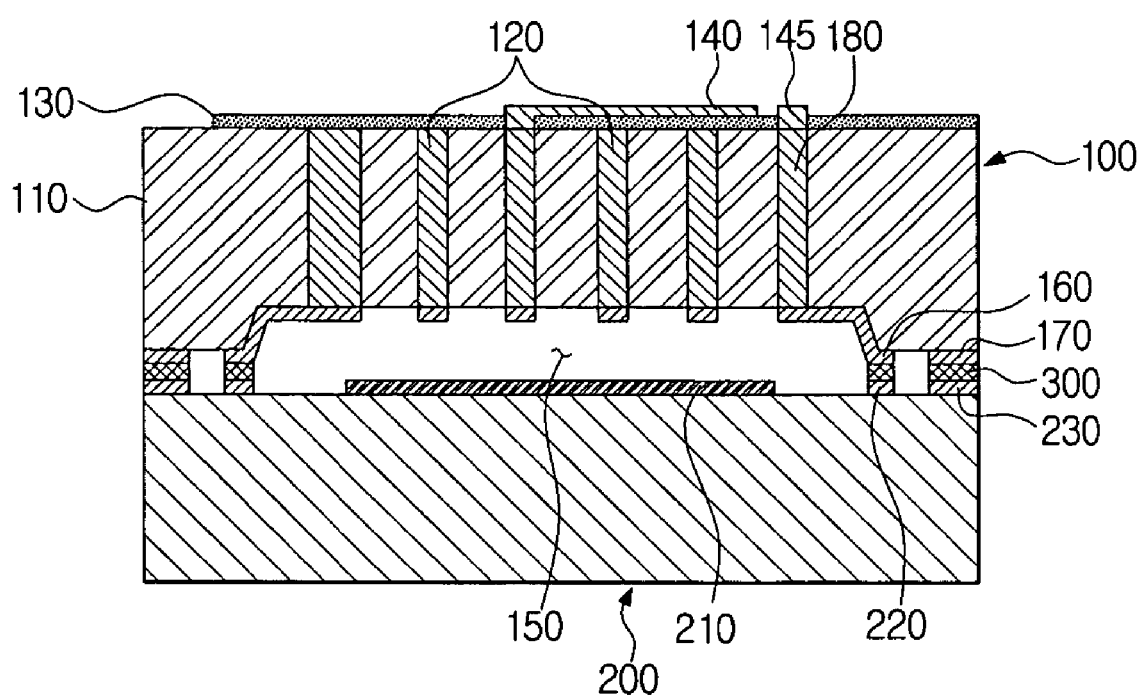
FIG. 3 is a cross-sectional view illustrating one example of the micro device package using the cap of FIG. 2 according to an exemplary embodiment of the present invention.

FIG. 3 is a cross-sectional view illustrating the micro device package having the cap 100 of FIG. 2. As shown in FIG. 3, in the micro device package, a micro device 210, an electrode pad 220 and a sealing pad 230 are formed in proper positions of a package body 200. The cap 100 is coupled to the package body 200, so that the micro device 210 can be positioned in the cavity 150 of the cap 100. The coupling process is carried out by using an adhesive or solder 300.

In the micro device package structure, the micro device can be a MEMS device requiring an operation space. In more detail, the MEMS device can be an RF duplexer or a micro switch.

The manufacturing method of the cap for the micro device package having the inductor embedded in the substrate in accordance with the present invention will now be described with reference to FIG. 4.

Figure 4A:
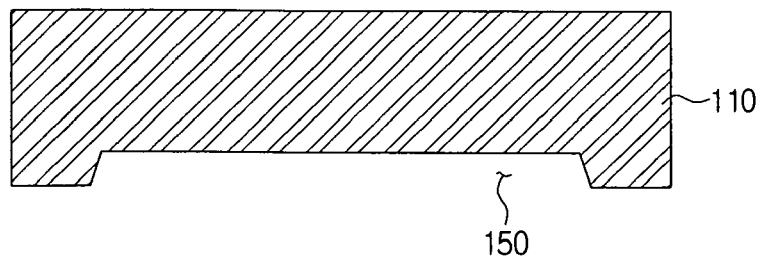
FIGS. 4A to 4G are process views illustrating a manufacturing method of a cap for a micro device package having an inductor embedded in a substrate in accordance with an exemplary embodiment of the present invention.

As illustrated in FIG. 4A, a cavity 150 is formed by etching a predetermined area of a lower portion of a substrate 110. In the case that the inductor embedded in the substrate is used as a simple inductor as shown in FIG. 1, it is not necessary to form the cavity 150. The position of the cavity 150 corresponds to a device area of a package body 200. The cavity 150 may be formed according to a wet etching method using chemical solution, such as acetic acid, hydrofluoric acid, and phosphoric acid, or a dry etching method using gas, plasma and ion beam.

Figure 4B:
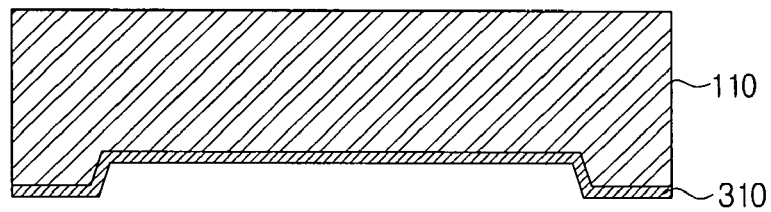

As shown in FIG. 4B, a seed layer 310 for plating is formed by depositing a metal on the bottom surface of the substrate 110 including the surface of the cavity 150.

Figure 4C:
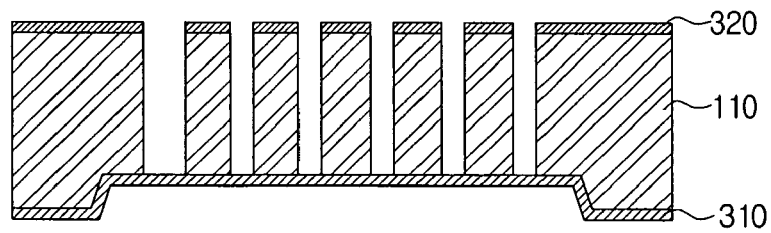

As depicted in FIG. 4C, an etch mask pattern 320 is formed on the top surface of the substrate 110, and a hole 111 having a high aspect ratio is processed by dry etching that is one of the bulk micromachining methods. The hole 111 is formed in a square spiral shape. In exemplary embodiments, the mask pattern 320 is made of photoresist having a thickness of 10 μm, and the dry etching is the ICP RIE (induced coupled plasma ion etching). After the dry etching, the mask pattern 320 is removed.

Figure 4D:
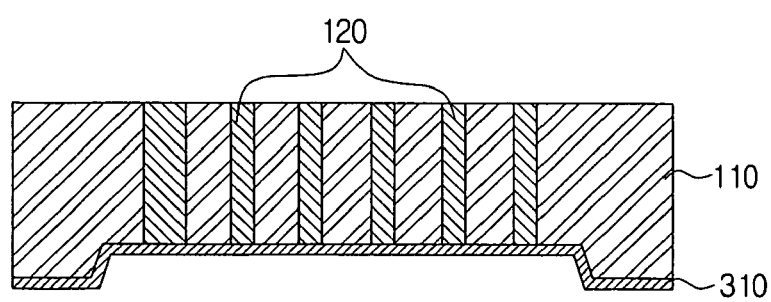

Referring to FIG. 4D, a coil electrode 120 is formed by filling a metal in the hole 111 by the plating process using the seed layer 310. Preferably, the plating process is an electroplating process, and the plating material is a metal having high electric conductivity, such as gold, copper and silver.

Figure 4E:
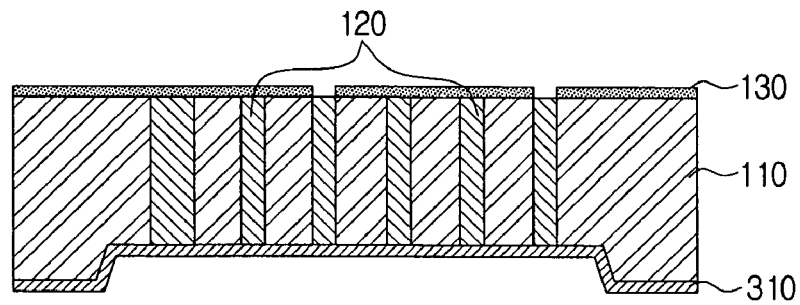

As illustrated in FIG. 4E, an insulation layer 130 pattern is formed on the top surface of the substrate 110. Preferably, the insulation layer 130 is made of a low dielectric material, for example, benzocyclobutene and polyimide. Here, the insulation layer 130 serves to electrically insulate an external connection pad 140 connected to the coil electrode 120 and the middle portion of the coil electrode 120. In order to minimize an unnecessary capacitance of the inductor, the insulation layer 130 is made of a low dielectric material such as benzocyclobutene and polyimide.

As a frequency rises, self energy of the inductor gradually decreases and energy by a capacitance gradually increases. Therefore, the inductor is not normally operated, and a self resonance frequency operated as a capacitor is generated. In order to solve the above problems, the insulation layer 130 may be made of a low dielectric material and thickened to minimize a parasitic capacitance between the coil electrode 120 and the external connection pad 140.

Figure 4F:
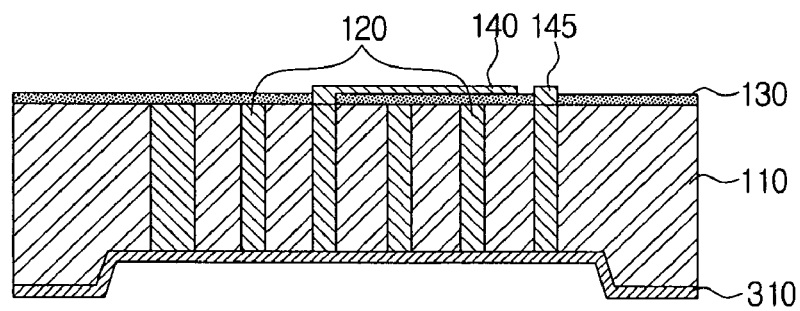

Referring to FIG. 4F, the external connection pad 140 is formed on the insulation layer 130. The external connection pad 140 is made of the same material as the coil electrode 120.

Figure 4G:
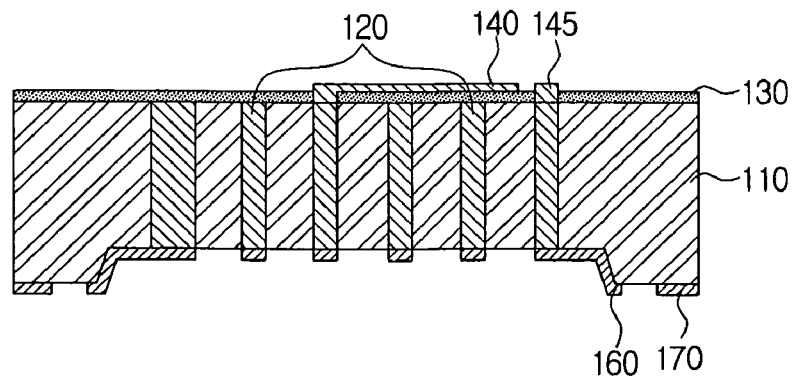

As shown in FIG. 4G, an electrode pad 160 and a sealing pad 170 are formed by patterning the seed layer on the bottom surface of the substrate 110. As a result, the micro device package having the inductor of FIG. 3 can be manufactured by coupling the cap 100 for the micro device package manufactured by the above process to the package body 200.

As discussed earlier, in accordance with the present invention, since the inductor is formed by embedding the coil electrode in the substrate, the inductor has the high inductance as compared with design space utilization. In addition, the size of the product using the inductor can be reduced.

Furthermore, because the inductor-embedded substrate is used as the cap for the micro device package, the inductor and other devices can be packaged as a single chip, to simplify the electronic circuit and improve the freedom degree of circuit design.

The foregoing exemplary embodiments are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A micro device package, comprising:
   a package body on which a micro device and an electrode pad are formed; and
   a cap coupled to the package body, for sealing up the micro device,
   wherein the cap comprises:
   a substrate having a cavity on its bottom surface;
   an inductor having a coil electrode formed by filling a metal in a hole formed on the substrate;
   a device connection pad formed on the bottom surface of the substrate to contact the electrode pad of the package body; and
   a second external connection pad connected to the device connection pad and exposed through a top surface of the substrate.

2. The micro device package as claimed in claim 1, wherein the coil electrode is formed in a linear spiral shape.

3. The micro device package as claimed in claim 1, wherein the coil electrode is formed in a curved spiral shape.

4. The micro device package as claimed in claim 1, wherein the substrate is a Si substrate.

5. The micro device package as claimed in claim 1, wherein the coil electrode comprises gold, silver, copper, or a combination thereof.

6. The micro device package as claimed in claim 1, wherein the second external connection pad is made of the same metal as the coil electrode.

7. The micro device package as claimed in claim 1, wherein the micro device is a MEMS device.

8. The micro device package as claimed in claim 7, wherein the MEMS device is an RF duplexer or a micro switch.

* * * * *